United States Patent
Higuchi (10) Patent No.: US 11,769,667 B2
(45) Date of Patent: Sep. 26, 2023

(54) TEMPLATE, METHOD FOR PRODUCING TEMPLATE, AND METHOD FOR PRODUCING SEMICONDUCTOR DEVICE

(71) Applicant: KIOXIA CORPORATION, Tokyo (JP)

(72) Inventor: Takeshi Higuchi, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/009,491

(22) Filed: Sep. 1, 2020

(65) Prior Publication Data

US 2021/0287899 A1 Sep. 16, 2021

(30) Foreign Application Priority Data

Mar. 10, 2020 (JP) .................................. 2020-041100

(51) Int. Cl.
*H01L 21/027* (2006.01)
*G03F 7/00* (2006.01)

(52) U.S. Cl.
CPC ........ *H01L 21/0271* (2013.01); *G03F 7/0002* (2013.01); *Y10T 428/24628* (2015.01)

(58) Field of Classification Search
CPC ............... G03F 7/0002; H01L 21/0273; H01L 21/0332; H01L 21/0271
See application file for complete search history.

(56) References Cited

U.S. PATENT DOCUMENTS

| 8,895,235 | B2 | 11/2014 | Ueno et al. | |
|---|---|---|---|---|
| 2019/0194530 | A1* | 6/2019 | Sekiguchi | .............. G02B 5/201 |
| 2019/0251897 | A1* | 8/2019 | Toyama | ................. G02B 5/003 |
| 2020/0105972 | A1* | 4/2020 | Dimitropoulos | ........ H01L 33/06 |
| 2021/0151637 | A1* | 5/2021 | Martin | ................. H01L 33/502 |
| 2021/0343905 | A1* | 11/2021 | Kishimoto | .............. H01L 33/62 |

FOREIGN PATENT DOCUMENTS

| JP | 6014096 B2 | 10/2016 |
|---|---|---|
| JP | 2018014483 A | 1/2018 |

OTHER PUBLICATIONS

"Mesa" Definition Google search via https://www.google.com/search?q=mesa+definition&rlz=1C1GCEA_enUS794US794&oq=mesa+def&aqs=chrome.1.69i57j0i433i512j0i512l6j46i175i199i512j0i512.3663j1j1&sourceid=chrome&ie=UTF-8 ; p. 1; No date available.*

* cited by examiner

*Primary Examiner* — Binh X Tran
(74) *Attorney, Agent, or Firm* — Kim & Stewart LLP (57) ABSTRACT

According to one embodiment, a template for nanoimprint lithography includes a substrate having a main surface and a mesa structure on the main surface. The mesa structure has an upper surface that can be patterned with recesses or the like. A film containing a quantum dot or quantum dots is on the main surface other than the upper surface of the mesa structure. The quantum dot can absorb ultraviolet light and emit visible light.

20 Claims, 7 Drawing Sheets

CROSS-SECTION A-A'

CROSS-SECTION B-B'

FIG. 7

TEMPLATE, METHOD FOR PRODUCING TEMPLATE, AND METHOD FOR PRODUCING SEMICONDUCTOR DEVICE

CROSS-REFERENCE TO RELATED APPLICATION(S)

This application is based upon and claims the benefit of priority from Japanese Patent Application No. 2020-041100, filed Mar. 10, 2020, the entire contents of which are incorporated herein by reference.

FIELD

Embodiments described herein relate generally to a template, a method for producing a template, and a method for producing a semiconductor device.

BACKGROUND

As a lithography process for producing semiconductor devices, nanoimprint lithography has been proposed as replacement for optical lithography as a method for transferring a pattern. In nanoimprint lithography, a template having a pattern is directly pressed onto a substrate, to which a liquid organic material has been applied, to transfer the pattern.

DETAILED DESCRIPTION

Certain embodiments provide a template that prevents unintended curing of a UV-curable imprint resist that might occur via leakage of ultraviolet light and further facilitates observation of an alignment mark using visible light.

In general, according to one embodiment, a template includes a substrate having a main surface, a mesa structure protruding from the main surface and having a first surface, and a film containing a quantum dot on the main surface outside of the mesa structure. In some embodiment, the film may also be on a side surface of the mesa structure. The quantum dot can absorb ultraviolet light (such as used in curing of nanoimprint resists) and emit visible light via fluorescence.

Hereinafter, example embodiments of the present disclosure will be described with reference to the drawings. In the following description of the drawings, the same or substantially similar portions are given the same reference numerals. In general, the drawings are schematic, and, as such, depicted relationships between thicknesses and planar sizes of aspects in the drawings can be different from those in actuality.

A template according to an embodiment will be described. The template according to the embodiment can be an original plate (also sometimes referred to as a mold, an imprint mold, a nanoimprint template, or the like) that is used in microfabrication processes for production of a semiconductor device using nanoimprint lithography.

Figure 1A:
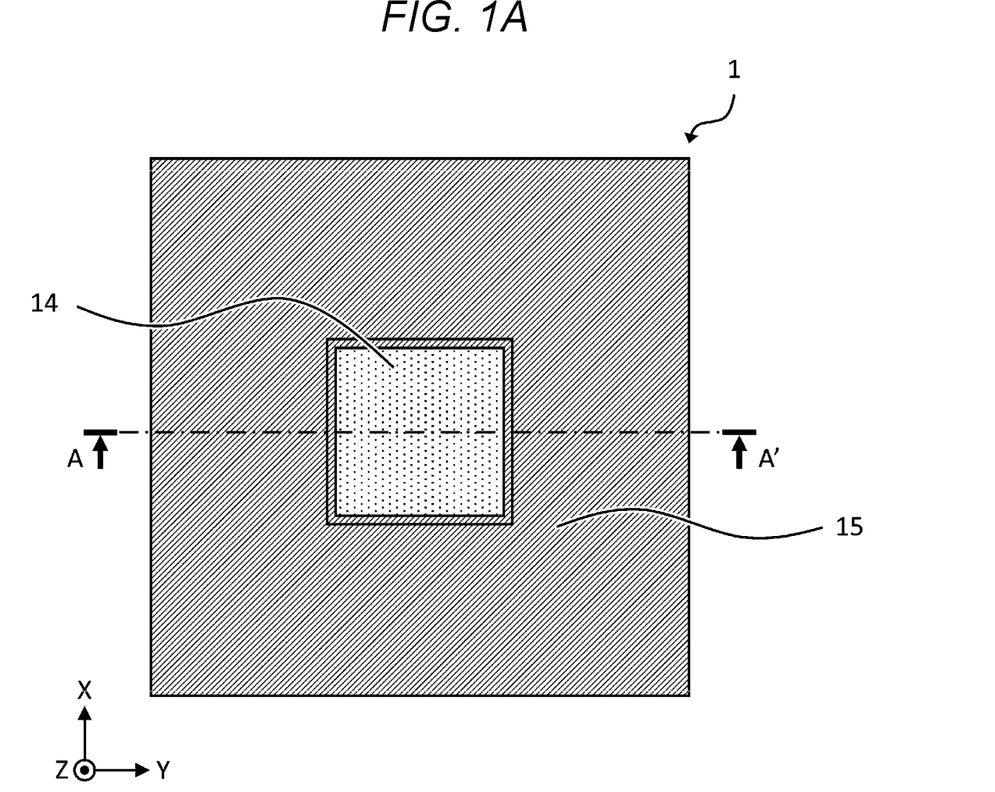
FIGS. 1A and 1B are views illustrating a configuration of a template according to an embodiment.
Figure 1B:
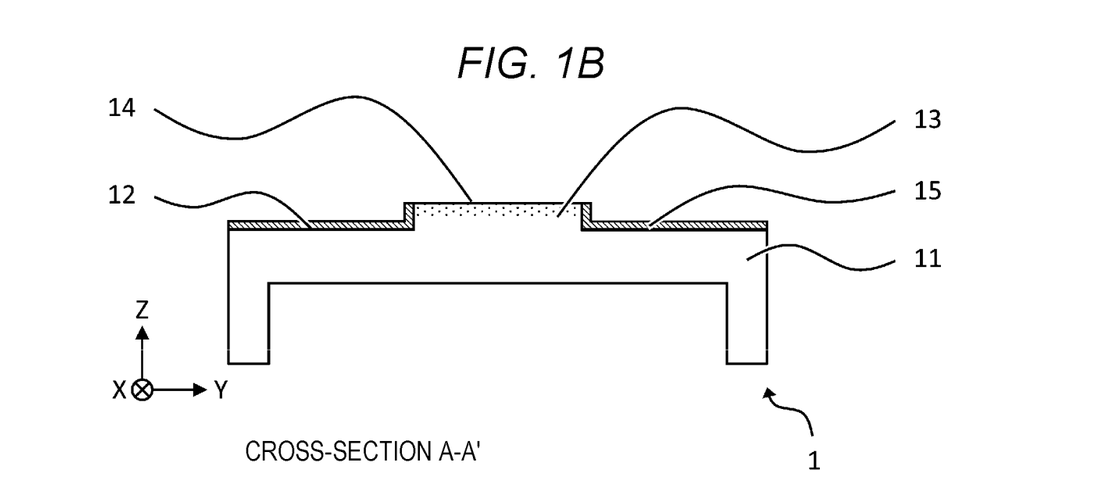

FIGS. 1A and 1B are views illustrating a configuration of a template 1 according to the embodiment. FIG. 1A is a plan view of the template 1 when viewed in a Z direction. FIG. 1B is a cross-sectional view of the template 1 taken along AA' and viewed in an X direction. The template 1 is produced by processing a substrate 11 that is a quadrilateral shape when viewed in the Z direction. In a case of nanoimprint lithography using light for curing an imprint resist, the template comprises a transparent material, such as quartz, as a main component. At a center of a main surface 12 of the substrate 11, a mesa structure 13 that protrudes from the main surface 12 is provided. The mesa structure 13 has a pattern surface 14. The pattern surface 14 includes a recessed structure or recesses therein that forms a transfer pattern (that is, a pattern to be transferred to another substrate) and/or an alignment mark. In an outer circumferential region of the mesa structure 13 and a side surface of the mesa structure 13, a material film 15 is provided. The material film 15 contains quantum dot(s) 5 and surrounds the mesa structure 13.

Figure 2:
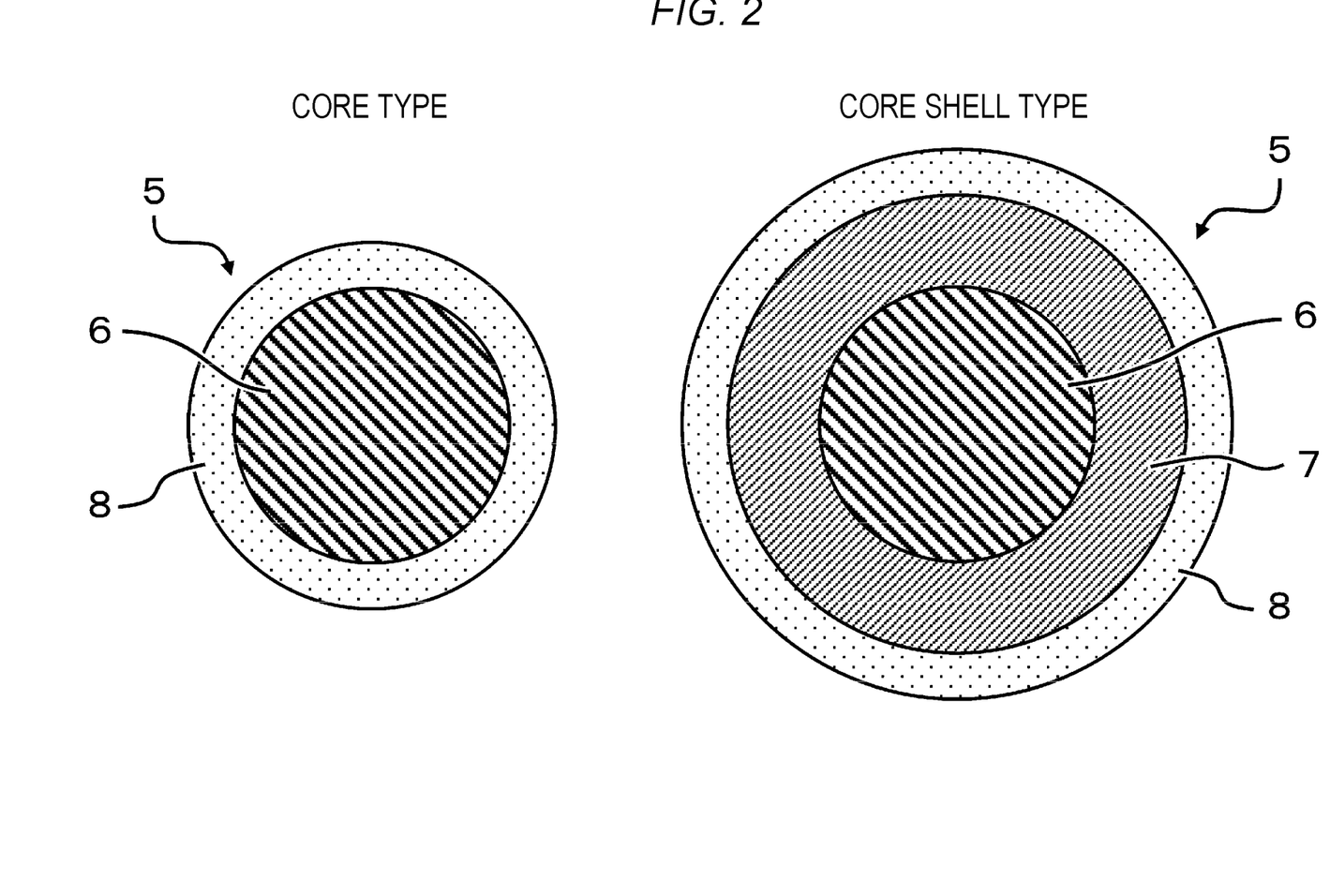
FIG. 2 is a view illustrating structures of a quantum dot according to an embodiment.

FIG. 2 is a view illustrating a structure of a quantum dot 5 according to the embodiment. The quantum dot 5 is a microcrystal of a semiconductor compound. The possible structures of the quantum dot 5 can be broadly classified into a core type and a core-shell type, as illustrated in FIG. 2. The core shell-type quantum dot 5 has a structure in which a surface of a core 6 is covered with a shell 7.

The core 6 contains a semiconductor element or a compound semiconductor material that has a rutile-type or perovskite-type crystalline structure. For example, the compound semiconductor material includes a combination of Groups II and VI elements, Groups III and V elements, or Groups IV and VI elements. For example, the core 6 contains any of cadmium sulfide (CdS), cadmium selenide (CdSe), cadmium telluride (CdTe), zinc sulfide (ZnS), ZnCdSe, indium phosphide (InP), silicon (Si), lead (Pd), lead sulfide (PbS), roquesite ($CuInS_2$), carbon (C), or graphene.

The shell 7 contains an inorganic substance such as zinc sulfide or silicon dioxide.

A protective material 8 (also referred to as a protective coating) contains an organic material that has high affinity towards the surface of the core 6 or the shell 7. The protective material 8 includes a bondable functional group. The organic material for the protective material 8 may be a polymer or a small molecular compound. Examples of the organic material for the protective material 8 include organic acids, such as citric acid and oleic acid, or a polymer having an amino group, a thiol group, or a phosphate group.

The quantum dot 5 may be just the core 6 or may be the core 6 and the shell 7 together. The quantum dot 5 can be utilized to absorb a particular wavelength of ultraviolet light or the like depending on the particle diameter thereof and then emit fluorescence that is mainly visible light. The quantum dot 5 has higher photoconversion efficiency than an organic fluorochrome having the same characteristics as those of the quantum dot 5. The quantum dot 5 also has higher durability than an organic fluorochrome. The quantum dot 5 can generally be dispersed in water or an organic solvent. Therefore, the quantum dot 5 is a material that facilitates application and formation of a layer including the quantum dot 5.

In a method for producing the template according to the present embodiment, a resist material that is cured by ultraviolet light is used. It is desirable that the quantum dot 5 be one that absorbs ultraviolet light corresponding to the resist curing wavelength and emits visible light. Specific examples of the quantum dot 5 include a graphene quantum dot that absorbs light having a wavelength of 360 nm and emits light having a wavelength of 440 nm.

The method for producing the template according to the embodiment will be described with reference to FIGS. 3A to 3E. FIGS. 3A to 3E are views illustrating a method for producing the template 1 according to an embodiment.

Figure 3A:
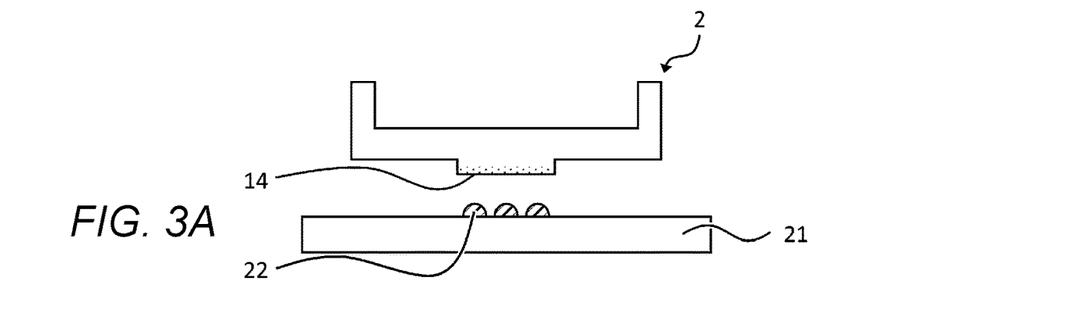
FIGS. 3A to 3E are views illustrating a method for producing a template according to an embodiment.

A template 2 having a substrate with a main surface and a mesa structure on the main surface is first prepared. The mesa structure has a pattern surface 14. The template 2 may have a transfer pattern or an alignment mark already formed there on, or may be a blank template before formation of a transfer pattern or an alignment mark thereon.

Figure 3B:
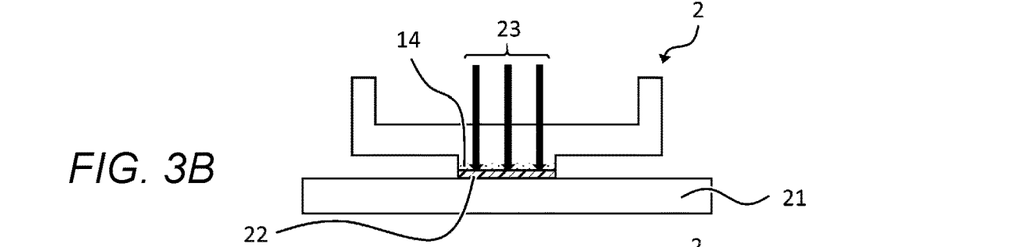
Figure 3C:
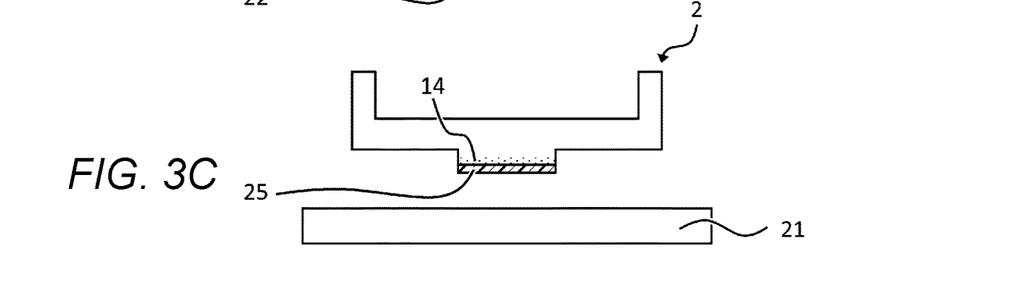

As illustrated in FIG. 3A, a photocurable resist 22 is applied to a substrate 21. As illustrated in FIG. 3B, the pattern surface 14 of the template 2 is pressed onto the photocurable resist 22. The photocurable resist 22 is then irradiated with exposure light 23 and cured (hardened to a solid or the like). As illustrated in FIG. 3C, the photocurable resist 22 and the template 2 are then separated from the substrate 21. That is, the now cured photocurable resist 22 adheres to the pattern surface 14 rather than the substrate 21 and thus forms a protective film 25 covering the pattern surface 14.

In this embodiment, the photocurable resist 22 is a nanoimprint resist material for forming the protective film 25. However, the photocurable resist 22 material is not particularly limited to nanoimprint resists only and can be any material as long as such material can form the protective film 25 in the described manner.

Figure 3D:
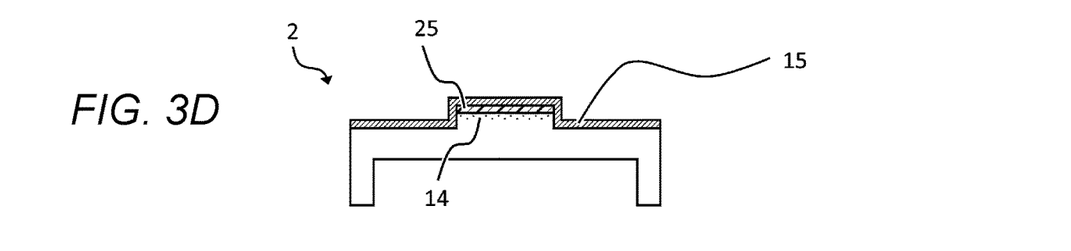
Figure 3E:
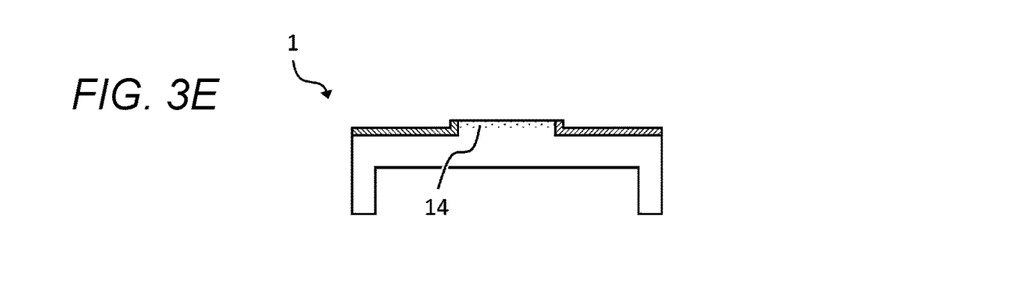

After the formation of the protective film 25, the material film 15 containing the quantum dot 5 is formed as illustrated in FIG. 3D. For example, a dispersion solution containing the quantum dot 5 is applied, and the solvent in the dispersion solution is then removed by heating or the like, to form the material film 15. The material film 15 may contain a polymer to enhance adhesion to the template 2. Examples of such a polymer include polyacrylic acid, polyvinyl alcohol, and polyacrylamide. The polymer may be mixed in the dispersion solvent or be in the protective material 8 of the quantum dot 5. As illustrated in FIG. 3E, the protective film 25 and the material film 15 are then removed from the pattern surface 14. Thus, a template 1 according to the embodiment can be produced. As a subsequent step, a step or steps for forming a transfer pattern or an alignment mark may be carried out on the template 1.

FIGS. 4A to 4E are views illustrating a method for producing the semiconductor device using the template 1 according to the embodiment.

Figure 4A:
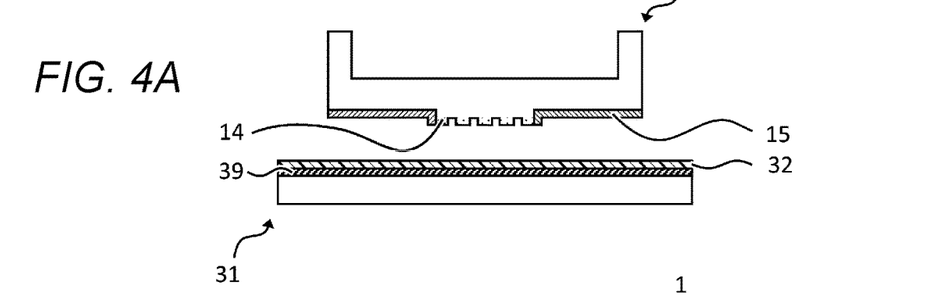
FIGS. 4A to 4E are views illustrating a method for producing a semiconductor device according to an embodiment.

As illustrated in FIG. 4A, an ultraviolet light-curable resist 32 is applied to a substrate 31. For example, the substrate 31 is a silicon substrate or an silicon-on-insulator (SOI) substrate. On a surface of the substrate 31, a film 39 may be formed.

Figure 4B:
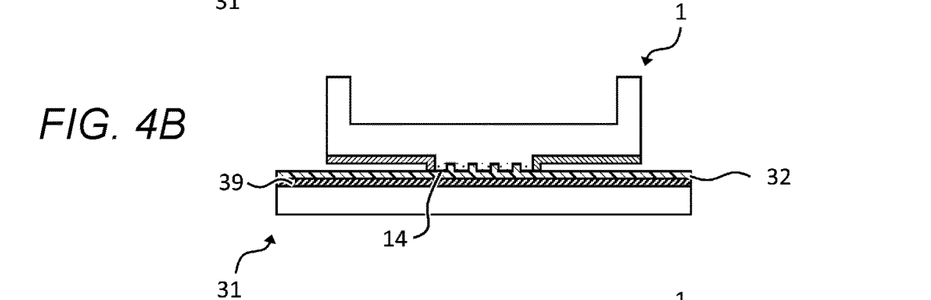

As illustrated in FIG. 4B, the pattern surface 14 of the template 1 is then brought into contact with the ultraviolet light-curable resist 32. Recesses in the pattern surface 14 are filled with the ultraviolet light-curable resist 32 during this process.

Figure 4C:
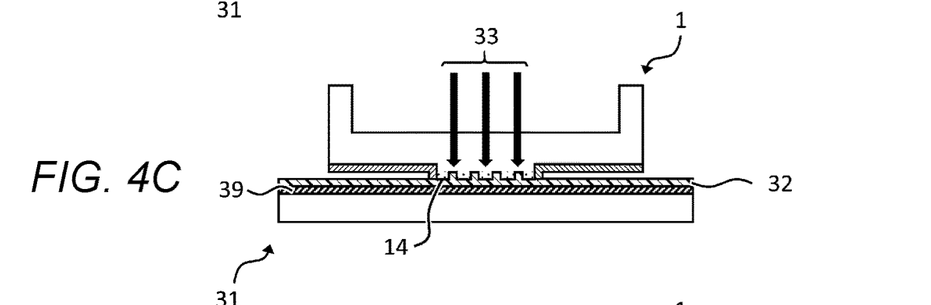

Subsequently, while the pattern surface 14 of the template 1 is still in contact with the ultraviolet light-curable resist 32, the ultraviolet light-curable resist 32 is irradiated with exposure light 33 (which includes ultraviolet light), as illustrated in FIG. 4C. As a result, the ultraviolet light-curable resist 32 is cured.

Figure 4D:
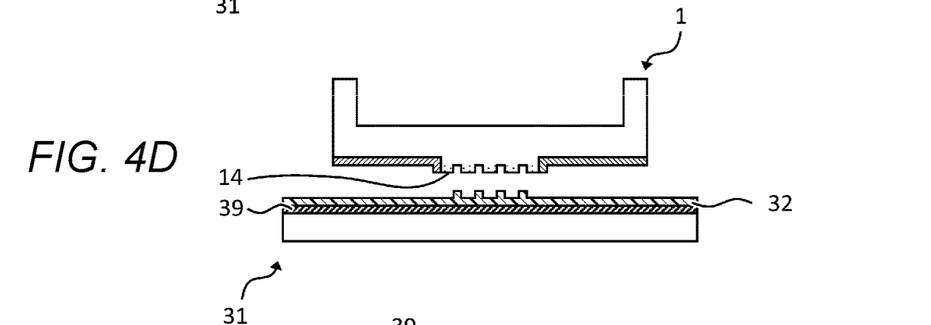

As illustrated in FIG. 4D, the template 1 is then separated from the now-cured ultraviolet light-curable resist 32.

Figure 4E:
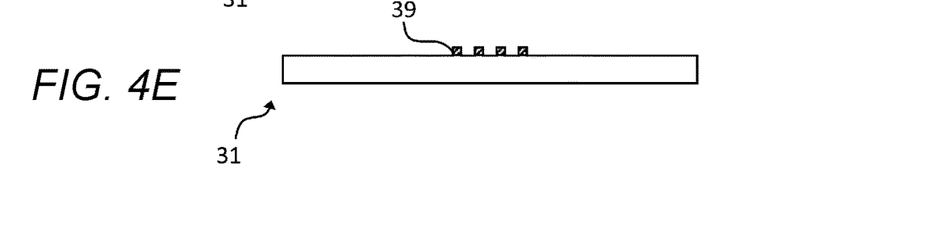

As illustrated in FIG. 4E, the substrate 31 can be etched using the patterned ultraviolet light-curable resist 32 as a mask. As a result, a pattern on the template 1 can be formed on the substrate 31 and transferred thereto. When the film 39 is a polysilicon film or a metal film, a fine electrode pattern or wiring pattern can be formed therefrom. When the film 39 is an insulating film, a fine contact hole pattern or gate insulating film can be formed therefrom. When there is no film 39 t on the substrate 31 and an uppermost layer of the substrate is a semiconductor material, a fine element isolation trench or the like can be formed.

Figure 5:
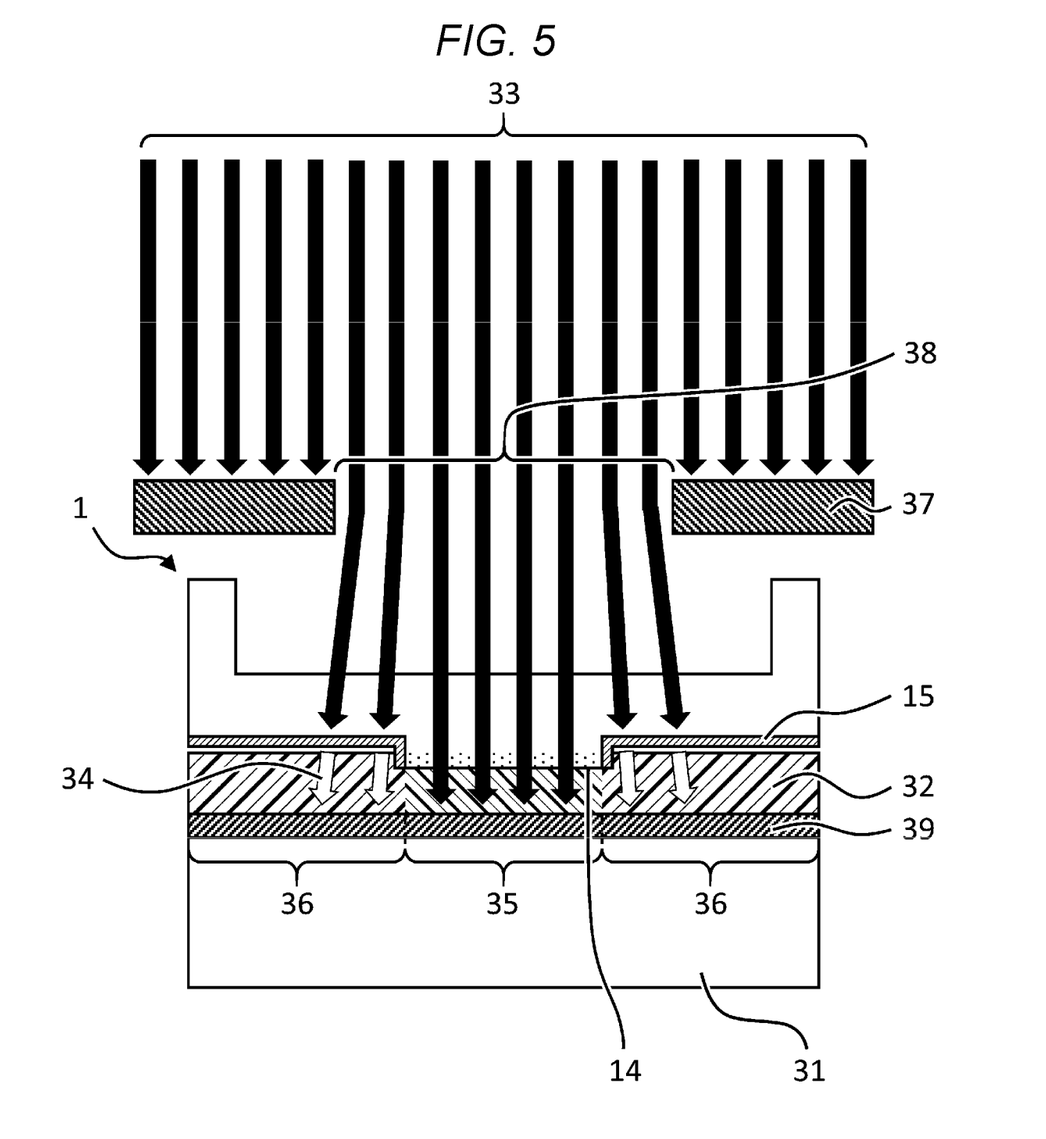
FIG. 5 is a view illustrating additional aspects of a method for producing a semiconductor device according to an embodiment.

Next, the step illustrated in FIG. 4C will be further described using FIG. 5. FIG. 5 is a view illustrating aspects of the method for producing a semiconductor device using the template 1.

In nanoimprint lithography using the template 1, the pattern surface 14 is pressed onto a transfer region 35 of the ultraviolet light-curable resist 32 on the substrate 31. The transfer region 35 is then irradiated with the exposure light 33, as illustrated in FIG. 5. Between the source of the exposure light 33 and the template 1, a light-shielding plate 37 having an opening 38 is provided. The template 1 is irradiated with the exposure light 33 that passes through the opening 38.

During irradiation with the exposure light 33, it is necessary to prevent leakage of ultraviolet light to a non-transfer region 36 adjacent to the transfer region 35. If the leakage of ultraviolet light can be prevented, unintended curing of the ultraviolet light-curable resist 32 in the non-transfer region 36 can be prevented. The light-shielding plate 37 helps prevents the leakage of ultraviolet light. However, it is difficult to prevent all the leakage of ultraviolet light to the non-transfer region 36 with only the light-shielding plate 37. This is because light is diffracted at the opening 38 and may spread outward with distance from the light-shielding plate 37 to the ultraviolet light-curable resist 32. Also, the opening 38 of the light-shielding plate 37 is typically designed to be somewhat larger in size than the transfer region 35 in consideration of errors associated with the precision of attachment or alignment of various components. Thus, a part of the non-transfer region 36 will typically be irradiated with the exposure light absent some other intervention.

However, as illustrated in FIG. 5, the material film 15 on the template 1 converts ultraviolet light contained in the exposure light 33 into visible light 34. For example, ultraviolet light of the exposure source has a wavelength of 300 to 400 nm. Visible light 34 has a wavelength of 400 to 800 nm. The ultraviolet light-curable resist 32 is not substantially or at all cured by visible light wavelength. Therefore, the ultraviolet light-curable resist 32 in the non-transfer region 36 is not significantly cured. Accordingly, the transfer region 35 can be irradiated with the exposure light 33 including ultraviolet light, and the unintended curing of the ultraviolet light-curable resist 32 in the non-transfer region 36 due to leakage of ultraviolet light can be decreased.

It is generally preferable that the material film 15 be provided outside the region occupied by mesa structure 13 but also on the side surfaces of the mesa structure 13. However, even if the material film 15 is not provided on the side surfaces so of the mesa structure 13, beneficial effects can still be obtained.

Figure 6A:
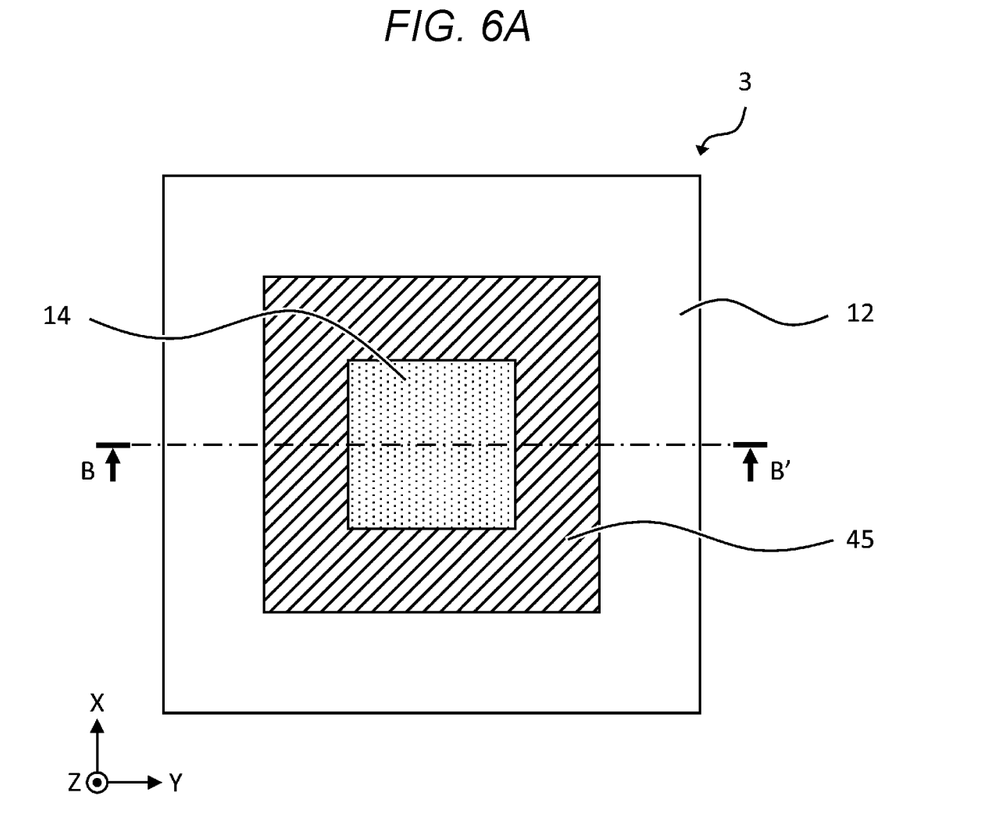
FIGS. 6A and 6B are views illustrating a configuration of a template according to a comparative example.
Figure 6B:
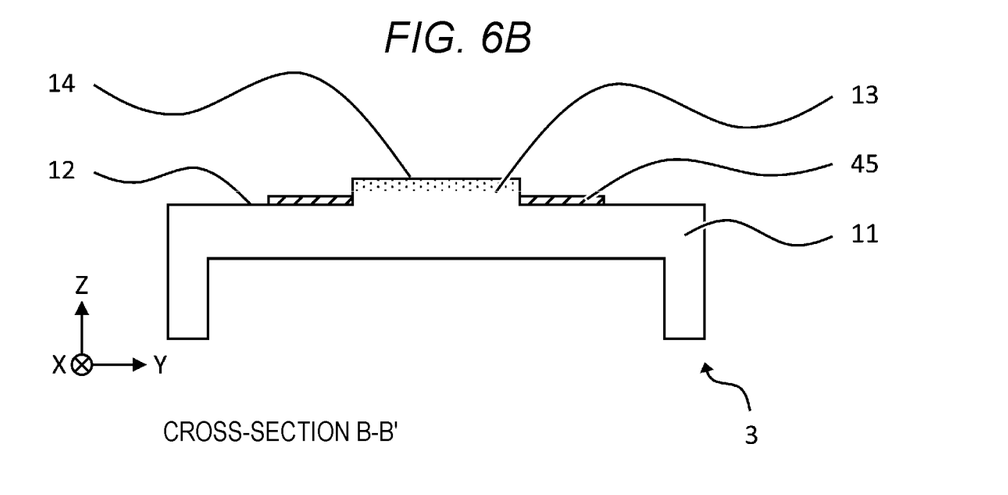

The effects of an embodiment as compared with a comparative example will be described with reference to FIGS. 6A, 6B, and 7. FIGS. 6A and 6B are views illustrating a configuration of a template 3 according to the comparative example. FIG. 6A is a plan view of the template 3 according to the comparative example when viewed in the Z direction. FIG. 6B is a cross-sectional view of the template 3 taken along BB' when viewed in the X direction. The template 3 is produced by processing a substrate 11 that is a quadrilateral shape when viewed in the Z direction. On the main surface 12 of the substrate 11, a mesa structure 13 including a pattern surface 14 is provided. A light-shielding film 45 is formed at the periphery of the mesa structure 13. Examples of a material of the light-shielding film 45 include a metallic material or a metal oxide, nitride, and/or oxynitride. Specific examples of a metal that can be used in the light-shielding film 45 include chromium (Cr), molybdenum (Mo), tantalum (Ta), tungsten (W), zirconium (Zr), and titanium (Ti).

Figure 7:
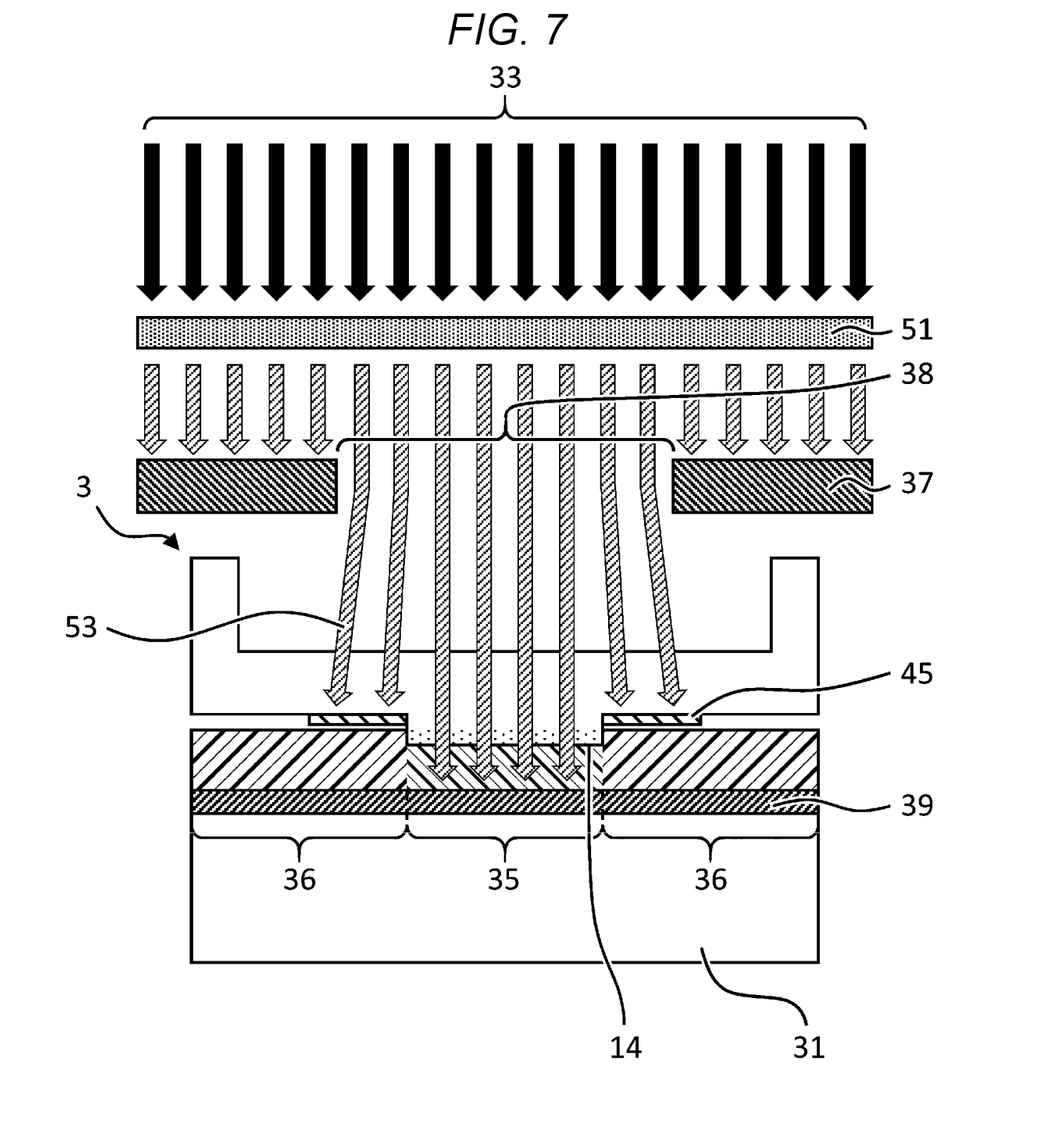
FIG. 7 is a view illustrating a method for producing a semiconductor device according to the comparative example.

FIG. 7 is a view illustrating a method for producing a semiconductor device using the template 3 according to the comparative example. As illustrated in FIG. 7, the template 3 is irradiated with the exposure light 33 through a filter 51 and a light-shielding plate 37 having an opening 38. The filter 51 is provided between the light source of the exposure light 33 and the light-shielding plate 37, and converts the exposure light 33 into a monochromatic light 53. The region that is irradiated with monochromatic light 53 is restricted by the light-shielding plate 37. The region that is irradiated with the monochromatic light 53 is also restricted by the light-shielding film 45 on the template 3. Only the ultraviolet light-curable resist 32 of the transfer region 35 is irradiated with the monochromatic light 53. When the exposure light 33 is converted into monochromatic light 53 by the filter 51, the angle at which the monochromatic light 53 is diffracted by the light-shielding plate 37 can be controlled/known. When the light-shielding film 45 is designed according to this angle, the leakage of ultraviolet light to the non-transfer region 36 can be more effectively prevented than otherwise. However, monochromatization using filter 51 decreases the light intensity of light reaching the transfer region 35. The decreased light intensity may require increases in the curing time of the ultraviolet light-curable resist 32, and this may affect throughput.

This method also includes a position alignment step before the imprint step. The position alignment step uses a mark that is provided on a stage supporting the substrate 31. In the position alignment step, the outer circumferential region of the mesa structure 13 is irradiated with visible light such as red light. However, the mark provided on the stage is difficult to be observed due to the presence of the light-shielding film 45, and the precision of position alignment may be decreased as a result.

In contrast, with the template 1 according to the embodiment, the material film 15, which converts ultraviolet light into visible light, is provided covering the outer circumferential region of the mesa structure 13. Therefore, it is not necessary that the exposure light diffraction angle be controlled/known. Thus, no filter 51 is necessary. Without the filter 51, the light intensity of ultraviolet light reaching the transfer region 35 can be improved. This makes it possible to shorten the curing time of the ultraviolet light-curable resist 32 and to improve the throughput. Also, since the material film 15 transmits visible light, the alignment mark provided on the stage is more easily observed for position alignment prior to imprinting. Thus, the precision in position alignment can be improved.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A template for nanoimprinting, the template comprising:
   a substrate having a first main surface;
   a mesa structure protruding from the first main surface in a first direction orthogonal to the first main surface, the mesa structure having a first surface parallel to the first main surface and spaced from the first main surface in the first direction; and
   a film containing quantum dots on the first main surface of the substrate outside of the mesa structure, wherein
   the first surface of the mesa structure includes a nanoimprint transfer pattern thereon, and
   the mesa structure is comprised of the same material as the substrate.

2. The template according to claim 1, wherein the film converts ultraviolet light into visible light.

3. The template according to claim 1, wherein quantum dots absorb ultraviolet light and emit visible light.

4. The template according to claim 1, wherein the quantum dots comprise at least one element selected from cadmium, zinc, indium, selenium, sulfur, silicon, and carbon.

5. The template according to claim 1, wherein
   a transmittance of ultraviolet light through the substrate via the first surface is greater than that of ultraviolet light through the substrate via the film, and
   a transmittance of visible light through the substrate via the film is greater than or equal to a transmittance of visible light through the substrate via the first surface.

6. The template according to claim 1, wherein the quantum dots are a core-type with a protective coating.

7. The template according to claim 1, wherein the quantum dots are a core-shell type with a protective coating.

8. The template according to claim 1, wherein the substrate is quartz.

9. The template according to claim 1, wherein the quantum dots comprise one of cadmium sulfide, cadmium selenide, cadmium telluride, zinc sulfide, zinc cadmium selenide, indium phosphide, lead sulfide, roquesite ($CuInS_2$), or graphene.

10. The template according to claim 1, wherein the mesa structure comprises quartz as a main component.

11. The template according to claim 1, wherein
    the substrate is quartz, and
    the mesa structure is quartz.

12. The template according to claim 1, wherein the mesa structure is a portion of the substrate.

13. The template according to claim 1, wherein the substrate and the mesa structure have identical composition as one another.

14. The template according to claim 1, wherein
the substrate has a second main surface on a side of the substrate opposite the first main surface in the first direction, and
the second main surface has a recess at position overlapping with the mesa structure in the first direction.

15. The template according to claim 1, wherein the substrate has a second main surface that is opposite the first main surface and has a concave structure having a planar dimension larger than the mesa structure.

16. The template according to claim 1, wherein the substrate comprises quartz as a main component.

17. The template according to claim 16, wherein the mesa structure comprises quartz as a main component.

18. The template according to claim 1, wherein
the mesa structure has four side surfaces that extend between the first main surface and the first surface, and
the film is on each of the four side surfaces.

19. The template according to claim 18, wherein
the quantum dots contained in portions of the film on the side surfaces opposite each other across the mesa structure have substantially equal particle sizes and emit substantially the same wavelength of light when exposed to ultraviolet light.

20. A method for producing a semiconductor device, the method comprising:
applying a photocurable imprint resist material to a semiconductor substrate;
bringing a template into contact with photocurable imprint resist material;
curing the photocurable imprint resist material; and
separating the template from the cured photocurable imprint resist material, wherein
the template comprises:
a substrate having a main surface;
a mesa structure protruding from the main surface in a first direction orthogonal to the main surface, the mesa structure having a first surface parallel to the main surface and spaced from the main surface in the first direction; and
a film containing quantum dots on the main surface of the substrate outside of the mesa structure,
the first surface of the mesa structure includes a nanoimprint transfer pattern thereon, and
the mesa structure is comprised of the same material as the substrate.

* * * * *